(12) United States Patent
Sorenson et al.

(10) Patent No.: US 11,493,534 B1
(45) Date of Patent: Nov. 8, 2022

(54) CONTINUOUS ONLINE SELF-CALIBRATING RESONANT FM MICROELECTROMECHANICAL SYSTEMS (MEMS) ACCELEROMETER

(71) Applicant: HRL Laboratories, LLC, Malibu, CA (US)

(72) Inventors: Logan D. Sorenson, Agoura Hills, CA (US); Lian X. Huang, Malibu, CA (US); Matthew J. Pelliccione, Malibu, CA (US); Raviv Perahia, Malibu, CA (US); Hung Nguyen, Los Angeles, CA (US); David T. Chang, Calabasas, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 244 days.

(21) Appl. No.: 16/673,878

(22) Filed: Nov. 4, 2019

Related U.S. Application Data

(60) Provisional application No. 62/788,254, filed on Jan. 4, 2019.

(51) Int. Cl.
*G01P 21/00* (2006.01)
*B81B 3/00* (2006.01)
*G01P 15/08* (2006.01)

(52) U.S. Cl.
CPC ............ *G01P 21/00* (2013.01); *B81B 3/0021* (2013.01); *G01P 15/08* (2013.01); *B81B 2201/0235* (2013.01); *G01P 2015/0831* (2013.01)

(58) Field of Classification Search
CPC ..................................................... G01P 21/00
USPC ........................................................ 73/1.38
See application file for complete search history.

(56) References Cited

U.S. PATENT DOCUMENTS 7,103,477 B1 9/2006 Lee
7,337,671 B2 3/2008 Ayazi
9,696,340 B2 7/2017 Trusov
(Continued)

OTHER PUBLICATIONS

Chen, Yi, et al. "Error Contributions during MEMS Gyroscope Calibration by Chip-Scale Micro-Stage with Capacitive Motion Sensor." 2018 IEEE/ASME International Conference on Advanced Intelligent Mechatronics (AIM). IEEE, 2018. (Year: 2018).*
(Continued)

*Primary Examiner* — Walter L Lindsay, Jr.
*Assistant Examiner* — Philipmarcus T Fadul
(74) *Attorney, Agent, or Firm* — Ladas & Parry, LLP

(57) ABSTRACT

A self-calibration method for an accelerometer having a proof mass separated by a gap from a drive electrode and a sense electrode includes initializing the accelerometer to resonate, applying a first bias voltage to the sense electrode and a second bias voltage to the drive electrode to obtain a first scale factor, measuring a first acceleration over a first time interval, swapping the first bias voltage on the sense electrode with the second bias voltage previously on the drive electrode and the second bias voltage on the drive electrode with the first bias voltage previously on the sense electrode so that a bias voltage on the sense electrode is set to the second bias voltage and a bias voltage on the drive electrode is set to the second bias voltage to obtain a second scale factor, measuring a second acceleration over a second time interval, and calculating a true acceleration.

22 Claims, 7 Drawing Sheets

(56) References Cited

U.S. PATENT DOCUMENTS

2018/0128850 A1* 5/2018 Bramhavar ............ G01P 21/00

OTHER PUBLICATIONS

U.S. Appl. No. 16/512,091.
Colibrys MS1000 accelerometer: www.colibrys.com/product/ms1000-mems-accelerometer/ (Printed: Jan. 16, 2020).
Comi, et al., "A new biaxial silicon resonant micro accelerometer," in 2011 IEEE 24th International Conference on Micro Electro Mechanical Systems, 2011, pp. 529-532.
Hopkins, R., "The Silicon Oscillating Accelerometer: A High-Performance MEMS Accelerometer for Precision Navigation and Strategic Guidance Applications", *The Draper Technology Digest*, vol. 10, CSDL-R-3005, 2006, pp. 4-13.
Zotov et al., "High Quality Factor Resonant MEMS Accelerometer with Continuous Thermal Compensation", IEEE Sensors Journal, vol. 15, No. 9, Sep. 2015.

* cited by examiner

CONTINUOUS ONLINE SELF-CALIBRATING RESONANT FM MICROELECTROMECHANICAL SYSTEMS (MEMS) ACCELEROMETER

CROSS REFERENCE TO RELATED APPLICATIONS

This application is related to and claims the benefit of U.S. Provisional Patent Application No. 62/788,254, filed on Jan. 4, 2019, and is related to U.S. patent application Ser. No. 16/512,091, filed Jul. 15, 2019, which are incorporated herein by reference as though set forth in full.

STATEMENT REGARDING FEDERAL FUNDING

None.

TECHNICAL FIELD

This disclosure relates to accelerometers and microelectromechanical systems (MEMS).

BACKGROUND

Accelerometers in the prior art have performance limitations due to bias errors. The bias errors may be time varying bias errors also known as bias drifts, which particularly limit performance, because with time varying bias errors the accelerometer cannot be entirely calibrated before use.

Reference [1], below, which is incorporated herein by reference, describes a prior art MEMS accelerometer fabricated on silicon-on-insulator (SOI) wafers or other suitable material using micromachining techniques in combination with an electronic circuit capable of driving the primary in-plane resonance mode of the accelerometer structure into sustained oscillations and frequency modulation (FM) readout of the up-converted inertial acceleration signal, which is mapped onto FM sidebands of the primary resonance oscillation frequency. It should be noted that some of the inventors of the present application are also inventors of the patent application referenced in Reference [1] below. The accelerometer structure is designed such that it has a high quality factor (Q>10,000) primary in-plane resonance mode with a natural frequency greater than 10 kHz. The resonant MEMS accelerometer is sealed in a vacuum package at less than 1 milliTorr to preserve the high Q of the silicon structure. In contrast to static MEMS accelerometers, which are limited to dynamic ranges <$10^6$ by their amplitude modulation (AM) readout mechanism, the FM mechanism employed in this prior art accelerometer allows dynamic ranges greater than $10^9$. Such a large dynamic range is necessary to enable large input ranges (>±100 g to ±1000 g) while simultaneously preserving the ability to accurately resolve small inertial signals below 1 µg, where 1 g=9.81 m/s$^2$. However, this prior art accelerometer has performance limitations due to time varying bias errors.

Reference [2], below, which is incorporated herein by reference, describes a prior art self-calibration method for an inertial instrument which has two inertial sensor devices. The reference describes an example gyroscope, but also mentions applying the technique to accelerometers. A disadvantage of the described method is that two inertial sensor devices are required.

References [3] and [4], below, which are incorporated herein by reference, describe a resonant MEMS accelerometer consisting of two independent resonators each formed from two coupled masses. This prior art describes a resonant MEMS accelerometer which uses the nonlinearity of a biased capacitive transduction gap to create a frequency shift of a resonance mode of the structure. However, references [3] and [4] do not disclose any method to perform self-calibration.

References [5] and [6], below, which are incorporated herein by reference, describe a typical approach to resonant MEMS accelerometers in which a mechanically-induced frequency shift is the main sensing mechanism.

References [7] and [8], below, which are incorporated herein by reference, describe "best-in-breed" prior art static MEMS accelerometers. As discussed above, a disadvantage of static MEMS accelerometers is their relatively low dynamic range, which may be defined as the ratio of the total input range divided by the smallest measurable signal.

REFERENCES

The following references are incorporated herein by reference as though set forth in full.

[1] U.S. Provisional Patent Application 62/701,240, filed Jul. 20, 2018, and corresponding U.S. patent application Ser. No. 16/512,091, filed Jul. 15, 2019, "A Navigational Grade Resonant MicroElectroMechanical Systems (MEMS) Accelerometer and Method of Operation", inventors Logan D. Sorenson, Lian X. Huang, Raviv Perahia, Hung Nguyen, David T. Chang.
[2] U.S. Pat. No. 7,103,477, issued Sep. 5, 2006 "Self-Calibration For An Inertial Instrument Based on Real Time Bias Estimator".
[3] U.S. Pat. No. 9,696,340, issued Jul. 4, 2017 "Multi-axis chip-scale MEMS inertial measurement unit (IMU) based on frequency modulation".
[4] Zotov et al., "High Quality Factor Resonant MEMS Accelerometer with Continuous Thermal Compensation", IEEE Sensors Journal, Vol. 15, No. 9, September 2015.
[5] C. Comi, A. Corigliano, G. Langfelder, A. Longoni, A. Tocchio, and B. Simoni, "A new biaxial silicon resonant micro accelerometer," in 2011 IEEE 24th International Conference on Micro Electro Mechanical Systems, 2011, pp. 529-532.
[6] Ralph Hopkins, Joseph Miola, Roy Setterlund, Bruce Dow, William Sawyer, "The Silicon Oscillating Accelerometer: A High-Performance MEMS Accelerometer for Precision Navigation and Strategic Guidance Applications", The Draper Technology Digest, Volume 10, CSDL-R-3005, 2006, pp. 4-13.
[7] U.S. Pat. No. 7,337,671 "Capacitive microaccelerometers and fabrication methods".
[8] Colibrys MS1000 accelerometer: https://www.colibrys.com/product/ms1000-mems-accelerometer/.

What is needed is an improved accelerometer that mitigates bias errors including time varying bias errors also known as bias drifts. The embodiments of the present disclosure answer these and other needs.

SUMMARY

In a first embodiment disclosed herein, a method for self-calibration of an accelerometer having a proof mass separated by a gap from a drive electrode and separated by a gap from a sense electrode comprises initializing the accelerometer to resonate, applying a first bias voltage to the sense electrode and applying a second bias voltage to the drive electrode to obtain a first scale factor $\Gamma=+|\Gamma|>0$, wherein a scale factor is a sensitivity of the accelerometer, a partial differential $$\frac{df_h}{da_{in}},$$

wherein $f_h$ is a harmonic frequency of the accelerometer, and wherein $a_{in}$ is an acceleration along an input axis (IA) of the accelerometer, measuring a first acceleration $\hat{a}_1$ over a first time interval, swapping the first bias voltage on the sense electrode with the second bias voltage previously on the drive electrode and the second bias voltage on the drive electrode with the first bias voltage previously on the sense electrode so that a bias voltage on the sense electrode is set to the second bias voltage and a bias voltage on the drive electrode is set to the first bias voltage to obtain a second scale factor $\Gamma=-|\Gamma|>0$, measuring a second acceleration $\hat{a}_2$ over a second time interval, and calculating a true acceleration $$a_{in} = \frac{\hat{a}_1 + \hat{a}_2}{2}.$$

In another embodiment disclosed herein, a method for self-calibration of an accelerometer having a proof mass separated by a gap from a drive electrode and separated by a gap from a sense electrode comprises initializing the accelerometer to resonate, applying a first bias voltage $V_B$ to the sense electrode and applying a second bias voltage $V_C$ to the drive electrode to obtain a first scale factor $\Gamma=+|\Gamma|>0$, wherein a scale factor is a sensitivity of the accelerometer, a partial differential $$\frac{df_h}{da_{in}},$$

wherein $f_h$ is a harmonic frequency of the accelerometer, and wherein $a_{in}$ is an acceleration along an input axis (IA) of the accelerometer, measuring a first acceleration $\hat{a}_1$ over a first time interval, adjusting the first bias voltage $V_B$ to the sense electrode and the second voltage $V_C$ to the drive electrode to obtain a second scale factor $\Gamma=A|\Gamma|$, where $$A = \frac{\Gamma_2}{\Gamma_1},$$

measuring a second acceleration $\hat{a}_2$ over a second time interval, and calculating a true acceleration $$a_{in} = \frac{(\hat{a}_1 + \hat{a}_2)}{2} - \left(\frac{1+\frac{1}{A}}{1-\frac{1}{A}}\right)\frac{(\hat{a}_1 - \hat{a}_2)}{2}.$$

In yet another embodiment disclosed herein, an accelerometer for providing continuous self-calibration comprises a proof mass suspended from a frame, a drive electrode separated from the proof mass by a first gap, a sense electrode separated from the proof mass by a second gap, a phase lock loop circuit coupled to the sense electrode and having a phase lock loop output, a calibration dither generator for generating a dither output for modulating a scale factor, wherein the scale factor is a sensitivity of the accelerometer, a partial differential $$\frac{df_h}{da_{in}},$$

wherein $f_h$ is a harmonic frequency of the accelerometer, and wherein $a_{in}$ is an acceleration along an input axis (IA) of the accelerometer, a drive bias offset voltage $V_C$, a summer coupled to the phase lock loop output, the dither output, and the drive bias offset voltage $V_C$ for providing a summer output having the sum of the phase lock loop output, the dither output, and the drive bias offset voltage $V_C$, wherein the summer output is coupled to the drive electrode, and wherein the phase lock loop circuit outputs the harmonic frequency of the accelerometer.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The present disclosure improves upon prior art accelerometers, including the one described in Reference [1], above, by including in the accelerometer continuous online self-calibration to estimate and mitigate bias errors, including time varying bias errors commonly known as bias drifts, which can be key performance limiters for MEMS accelerometers. Continuous and online self-calibration is preferred because the operation of the accelerometer is not interrupted for calibration, enabling the measurements to be made continuously and accurately in real time.

Static accelerometers have a low Q factor to avoid ringing in the accelerometer response. In the MEMS accelerometer described in Reference [1], the MEMS design and vacuum packaging produce silicon accelerometer structures with Q factors greater than 10,000 with natural frequencies greater than 10 kHz. Static MEMS accelerometers are limited to dynamic ranges <$10^6$ by their amplitude modulation (AM) readout mechanism. The FM mechanism employed in the accelerometer of Reference [1] provides dynamic ranges greater than $10^9$. Such a large dynamic range is necessary to enable large input ranges (>±100 g to ±1000 g) while simultaneously preserving the ability to accurately resolve small inertial signals below 1 μg. In addition, since the device described in Reference [1] operates at a higher natural frequency than a static accelerometer, the device is 25 to 2500× less sensitive to spurious vibration signals which can corrupt a true inertial acceleration signal.

Figure 1:
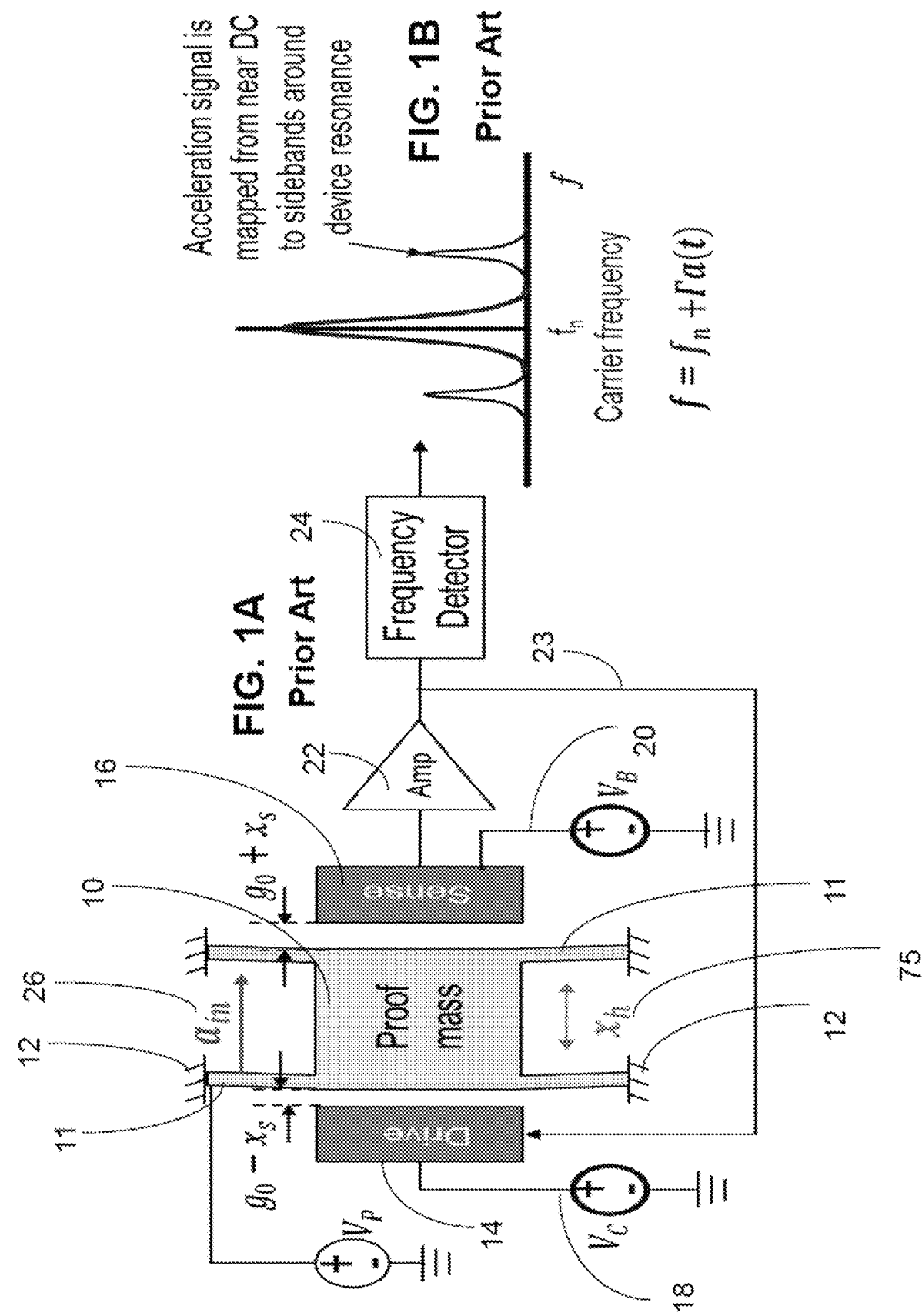
FIGS. 1A and 1B show a concept of operation for the accelerometer described in Reference [1] in accordance with the prior art.

FIGS. 1A and 1B show a concept of operation for the accelerometer described in Reference [1]. The resonant MEMS accelerometer described in Reference [1] and shown in FIG. 1A can achieve navigational grade performance (sub-micro-g) and at the same time accept high input ranges (up to ±1000 g and beyond). The present disclosure improves the accelerometer of Reference [1] by providing continuous online self-calibration of the accelerometer device to remove bias errors.

As shown in FIG. 1A, the accelerometer has a proof mass 10 suspended by springs 11 from a frame 12. The drive electrode 14 and the sense electrode 16 are separated by a gap from the proof mass 10. Voltages $V_C$ 18 and $V_B$ 20 are applied to the drive electrode 14 and sense electrode 16, respectively. An amplifier 22 and frequency detector 24 are connected to the sense electrode 16, and an output 23 of the amplifier 22 may be fed back to the drive electrode 14.

Preferably the accelerometer structure of FIG. 1A is completely symmetric by design, except when appropriate combinations of $V_B$ and $V_C$ are applied to the electrodes to purposefully unbalance the structure in one direction or the other. However, although the description describes a symmetric resonator as a preferred embodiment, the techniques disclosed herein may also be used with an asymmetric resonator. Asymmetry in the structure may arise, for example, if the accelerometer structure is imperfectly fabricated, even though the design of the accelerometer structure is for a symmetric structure. Any asymmetry in the resonator structure may be accounted for by first adjusting the combination of $V_B$ and $V_C$ as appropriate, and then applying the methods of the present disclosure. Therefore the methods of the present disclosure are equally applicable for an asymmetric resonator structure.

FIG. 1B shows the concept of operation for the resonant MEMS accelerometer of FIG. 1A. The acceleration signal is mapped from near direct current (DC) to a signal contained in the sidebands around the MEMS device's resonance frequency. Acceleration is detected through a change of the device's natural frequency and can be read out in the time domain using a frequency detector circuit 24, which may be digital or analog circuitry.

The scale factor Γ or the sensitivity $$\frac{df_h}{da_{in}}$$

is a critical parameter for operation of the resonant MEMS accelerometer, and has particular characteristics in the accelerometer that can be exploited to enable self-calibration, as explained further below. The scale factor Γ in units of Hz/(m/s^2) for the accelerometer of FIG. 1A is determined by the following equation:

$$\Gamma = \frac{df_h}{da_{in}} \approx \frac{3}{4\pi} \frac{\epsilon A}{M_{eff}\omega_n^3 g_0^4}\left[\frac{(V_P - V_C)^2}{\left(1 - \frac{x_s}{g_0}\right)^4} - \frac{(V_P - V_B)^2}{\left(1 + \frac{x_s}{g_0}\right)^4}\right].$$

The leading terms outside the bracket on the left are constants for a particular accelerometer device. The terms inside the bracket are shown below.

$$\Gamma \propto \left[\frac{(V_P - V_C)^2}{\left(1 - \frac{x_s}{g_0}\right)^4} - \frac{(V_P - V_B)^2}{\left(1 + \frac{x_s}{g_0}\right)^4}\right].$$

In the above expression, $x_s$ is the static displacement of the accelerometer proof mass 10 evaluated at zero input acceleration and can be found from the equation:

$$x_s = \frac{\frac{\epsilon A}{g_0^2}V_P(V_B - V_C) - \frac{1}{2}\frac{\epsilon A}{g_0^2}(V_B^2 - V_C^2)}{k - \frac{\epsilon A}{g_0^3}\left(2V_P^2 - 2V_P(V_B + V_C) + (V_B^2 + V_C^2)\right)}.$$

If one swaps the voltages $V_B$ 20 and $V_C$ 18 in the above, and then solves for the resulting displacement, one finds:

$$x_s' = \frac{\frac{\epsilon A}{g_0^2}V_P(V_C - V_B) - \frac{1}{2}\frac{\epsilon A}{g_0^2}(V_C^2 - V_B^2)}{k - \frac{\epsilon A}{g_0^3}\left(2V_P^2 - 2V_P(V_C + V_B) + (V_C^2 + V_B^2)\right)} =$$

$$\frac{-\left(\frac{\epsilon A}{g_0^2}V_P(V_B - V_C) - \frac{1}{2}\frac{\epsilon A}{g_0^2}(V_B^2 - V_C^2)\right)}{k - \frac{\epsilon A}{g_0^3}\left(2V_P^2 - 2V_P(V_B + V_C) + (V_B^2 + V_C^2)\right)}.$$

Comparing the two previous equations, one can draw the conclusion that $$x_s' = -x_s$$

when the drive electrode 14 voltage $V_C$ 18 and sense electrode 16 voltage $V_B$ 20 voltages are swapped, meaning one takes the voltage value that was applied to drive electrode 14 and applies it to sense electrode 16 and vice versa.

Armed with this result, performing the voltage swap yields:

$$\Gamma' \propto \left[\frac{(V_P - V_B)^2}{\left(1 - \frac{x'_s}{g_0}\right)^4} - \frac{(V_P - V_C)^2}{\left(1 + \frac{x'_s}{g_0}\right)^4}\right] = \left[\frac{(V_P - V_B)^2}{\left(1 + \frac{x_s}{g_0}\right)^4} - \frac{(V_P - V_C)^2}{\left(1 - \frac{x_s}{g_0}\right)^4}\right] = -$$

$$\left[\frac{(V_P - V_C)^2}{\left(1 - \frac{x_s}{g_0}\right)^4} - \frac{(V_P - V_B)^2}{\left(1 + \frac{x_s}{g_0}\right)^4}\right].$$

Comparing this expression with the previous expression for $\Gamma$ leads us to the conclusion that $$\Gamma' = -\Gamma$$

when the drive electrode 14 and sense electrode 16 voltages 18 and 20 are swapped. This is an extremely important result and enables self-calibration of the accelerometer shown in FIG. 1A through several different approaches, as described further below.

The meaning of the above result in the physical context of the operation of the accelerometer is described below. All accelerometers have what is known as an input axis (IA). For example, in FIG. 1A, the arrow 26 designated $a_{in}$ 26 denotes acceleration along the IA of the accelerometer. In the convention used in FIG. 1A, the IA arrow 26 is pointed to the right, meaning that the accelerometer is intended to assign a corresponding positive sign to positive accelerations in that direction. Therefore, drive electrode 14 voltage 18 and sense electrode 16 voltage 20 values are set to $V_B$ 20=$V_1$ and $V_C$ 18=$V_2$, respectively, to produce a positive $\Gamma$. Since voltage sources $V_B$ 20 and $V_C$ 18 are adjustable in the voltage value that they produce, their values can be swapped such that $V_B$ 20=$V_2$ and $V_C$ 18=$V_1$, producing a new scale factor $\Gamma'=-\Gamma$, in accordance with the above theory. Since these two accelerometer biasing cases have equal scale factors in magnitude, but with opposite sign, the result is equivalent to flipping the direction of the accelerometer input axis (IA). In other words, the second voltage biasing condition is a way to virtually rotate the IA so that it is 180° opposite to the IA of the first voltage biasing condition. This virtual method of rotation is equivalent to physically rotating the accelerometer in the first biasing condition by 180°.

In the preceding discussion, a method has been described for using our symmetric resonant accelerometer to reverse its input axis (IA) 26 through swapping of the bias voltage levels on the drive 14 and sense 16 electrodes. The input axis (IA) reversal is a consequence of the flipping of the sign of the scale factor upon swapping the bias voltages, leading to $\Gamma'=-\Gamma$. Next it is described how the reversal of the sign of the scale factor enables self-calibration of the accelerometer by removal of an unknown but fixed bias offset over two sequential acceleration measurements.

The following procedure is called a full IA reversal. First, two back to back readings are taken of the acceleration indicated by our accelerometer, $\hat{a}_1$ and $\hat{a}_2$, where the hat symbol (^) indicates a measurement or reading from the accelerometer. These measurements are each made over a finite time interval, which may be the same duration, and the time interval is also chosen such that the sequential measurements have approximately the same input acceleration ($a_{in}$) and bias offset ($B_f$). This means the measurements are made fast enough that the acceleration measured is the same and substantial bias drift has not occurred between the measurements. However, the scale factor $\Gamma$ used to make each measurement is allowed to change between sequential readings. The measurements so obtained can be expressed as:

$$\hat{a}_1 = \Gamma_1^{-1}(\Gamma_1 a_{in} + B_f)$$

$$\hat{a}_2 = \Gamma_2^{-1}(\Gamma_2 a_{in} + B_f)$$

Note that the bias offset represents an additive process in the above after the input acceleration is converted to a frequency by the scale factor $\Gamma$. Therefore, to obtain the acceleration measurement, the frequency reading is multiplied by the inverse scale factor.

During measurement interval 1, the scale factor $\Gamma_1 = \Gamma$, and during measurement interval 2, the scale factor $\Gamma_2 = \Gamma' = -\Gamma$ through appropriate combinations of $V_B$ 20 and $V_C$ 18 as explained previously.

Substituting into the Above Yields:

$$\hat{a}_1 = \Gamma^{-1}(\Gamma a_{in} + B_f)$$

$$\hat{a}_2 = -\Gamma^{-1}(-\Gamma a_{in} + B_f)$$

So $\hat{a}_1 + \hat{a}_2$ equals:

$$\hat{a}_1 + \hat{a}_2 = \Gamma^{-1}(\Gamma a_{in} + B_f) + \Gamma^{-1})+\Gamma^{-1}(-\Gamma a_{in}+B_f) = \Gamma^{-1}\Gamma a_{in} + \Gamma^{-1}B_f + \Gamma^{-1}\Gamma a_{in} - \Gamma^{-1}B_f$$

$$= 2\Gamma^{-1}\Gamma a_{in} = 2a_{in}.$$

This can be rearranged to get:

$$a_{in} = \frac{\hat{a}_1 + \hat{a}_2}{2}.$$

This is an unbiased, meaning calibrated, estimate of the true acceleration along the input axis (IA) from measurements $\hat{a}_1$ and $\hat{a}_2$.

It is important in high performance applications to monitor the bias offset to observe if it is drifting. This can be achieved by determining $$\hat{a}_1 - \hat{a}_2: \hat{a}_1 - \hat{a}_2 = \Gamma^{-1}(\Gamma a_{in} + B_f) - \Gamma^{-1}(-\Gamma a_{in} + B_f) =$$

$$\Gamma^{-1}\Gamma a_{in} + \Gamma^{-1}B_f - \Gamma^{-1}\Gamma a_{in} + \Gamma^{-1}B_f = 2\Gamma^{-1}B_f.$$

Rearranging gives the bias estimate as:

$$B_f = \Gamma \frac{\hat{a}_1 - \hat{a}_2}{2}.$$

The above expresses the bias offset in terms of a frequency. Alternatively, the bias offset can be expressed in native acceleration units by multiplying through by the inverse scale factor:

$$B_a = \Gamma^{-1}B_f = \Gamma^{-1}\Gamma \frac{\hat{a}_1 - \hat{a}_2}{2} = \frac{\hat{a}_1 - \hat{a}_2}{2}.$$

Figure 2:
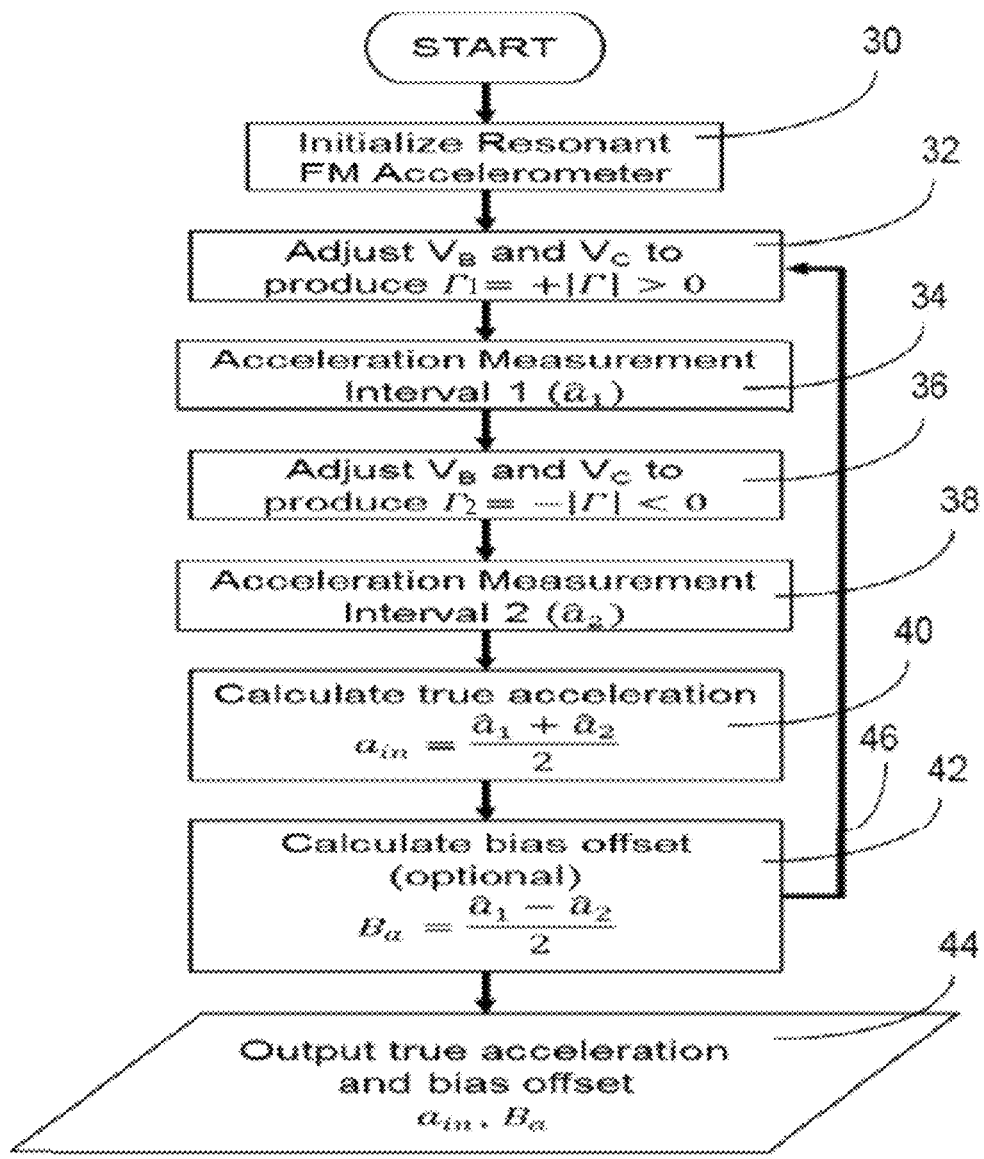
FIG. 2 shows a flow chart for a full input axis (IA) reversal self-calibration method for a symmetric resonant FM accelerometer in accordance with the present disclosure.

A flow chart describing the self-calibration algorithm using full IA reversal as described above is shown in FIG. 2. In step 30, the resonant FM accelerometer is initialized to be operational or in a resonant mode and therefore resonating. Then in step 32 bias voltages $V_B$ and $V_C$ are adjusted to produce $\Gamma_1 = +|\Gamma| > 0$. Next in step 34 an acceleration measurement $\hat{a}_1$ is made over a first interval. Then in step 36 $V_B$ and $V_C$ are adjusted by setting bias voltage $V_B$ to be equal to the previous $V_C$ and by setting bias voltage $V_C$ to be equal to the previous $V_B$ to produce $\Gamma_2=-|\Gamma|>0$. Next in step 38, an acceleration measurement $\hat{a}_2$ is made over a second interval. The first and second interval may have equal time spans. Then in step 40, the true acceleration $$a_{in} = \frac{\hat{a}_2 + \hat{a}_2}{2}$$

is calculated. Next in step 42 the bias offset $$B_a = \frac{\hat{a}_2 - \hat{a}_2}{2}$$

may be optionally calculated. Finally, in step 44 the true acceleration $a_{in}$ and bias offset $B_a$ may be outputted from the accelerometer. This self-calibration may be continually repeated as shown by the loop 46 from step 42 to step 32.

The accelerometer self-calibration method disclosed in the previous section is made possible by flipping the sign of the scale factor on an otherwise symmetric accelerometer device. This method is useful if the transitions between positive and negative scale factors during each measurement interval can be made quickly with respect to the application needs. However, during the transition from positive to negative scale factor and vice versa, the adjustment of the bias voltages $V_B$ 20 and $V_C$ 18 might be made instantaneously or smoothly over time. In the first case, the sudden switching of the bias voltages $V_B$ 20 and $V_C$ 18 can perturb the control loops of the accelerometer, which would then require subsequent time to re-stabilize to their nominal operating points. Thus, in the simplest case, the transition periods can be thought of as dead measurement time, since it would be difficult to extract meaningful acceleration measurements before the accelerometer is in stable operation. In the second case, the bias voltages are transitioned gradually or smoothly over time between measurements. This enables the control loops to track the accelerometer in a smooth manner and avoid the need to re-stabilize the control loops. However, if the time needed to make a smooth transition is too great, it slows the ability to obtain low noise stable acceleration measurements at constant scale factors.

If the restrictions caused by the adjustment of the bias voltages $V_B$ and $V_C$ made instantaneously or smoothly over time are too strict for a particular application, an alternative self-calibration method may be used, which is called partial input axis reversal. The advantage of partial input axis reversal that will become apparent is that the bias voltage changes do not have to be very abrupt and preserve the loop stability when transitioning scale factors. Smoothly transitioning the scale factor from fully positive to fully negative as described in the second example above can be thought of as an extreme case of partial input axis reversal.

To mathematically describe partial input axis (IA) reversal, one starts by making two acceleration measurements in sequential intervals, as before:

$$\hat{a}_1 = \Gamma_1^{-1}(\Gamma_1 a_{in} + B_f)$$

$$\hat{a}_2 = \Gamma_2^{-1}(\Gamma_2 a_{in} + B_f).$$

One also sets $\Gamma_1 = \Gamma$ as before. However, instead of setting $\Gamma_2 = -\Gamma$, one sets $\Gamma_2 = = A\Gamma$ such that $$A = \frac{\Gamma_2}{\Gamma_1}.$$

A is known because of the choice of $V_B$ and $V_C$. For example, for the embodiment shown in FIG. 4, the magnitude of $\Gamma$ can be ensured to not equal 0 by setting $V_B=0$ according to the equation above in paragraph [0030]. This is a preferred embodiment since it maximizes the sense current obtained from the device. However, the methods can work for any $V_B$ not equal to $V_C$; however, if $V_B$ is not equal to 0, there is less signal to work with and it may require the ability to set a negative bias potential which makes the implementation more complicated.

Making these substitutions gives:

$$\hat{a}_1 = \Gamma^{-1}(\Gamma a_{in} + B_f) = \Gamma^{-1}\Gamma a_{in} + \Gamma^{-1}B_f$$

$$\hat{a}_2 = (A\Gamma)^{-1}(A\Gamma a_{in} + B_f) = \frac{1}{A}\Gamma^{-1}A\Gamma a_{in} + \frac{1}{A}\Gamma^{-1}B_f = \Gamma^{-1}\Gamma a_{in} + \frac{1}{A}\Gamma^{-1}B_f$$

One can recognize that the first term in each measurement is the same. Therefore:

$$\hat{a}_1 - \hat{a}_2 = \Gamma^{-1}\Gamma a_{in} + \Gamma^{-1}B_f - \Gamma^{-1}\Gamma a_{in} - \frac{1}{A}\Gamma^{-1}B_f = \left(1 - \frac{1}{A}\right)\Gamma^{-1}B_f.$$

The above can be rearranged to estimate the bias offset:

$$B_f = \Gamma\left(\frac{\hat{a}_1 - \hat{a}_2}{1 - \frac{1}{A}}\right).$$

The next step is to add the two acceleration measurements:

$$\hat{a}_1 + \hat{a}_2 =$$

$$\Gamma^{-1}\Gamma a_{in} + \Gamma^{-1}B_f + \Gamma^{-1}\Gamma a_{in} + \frac{1}{A}\Gamma^{-1}B_f = 2\Gamma^{-1}\Gamma a_{in} + \left(1 + \frac{1}{A}\right)\Gamma^{-1}B_f.$$

Since $B_f$ is known, this becomes $$\hat{a}_1 + \hat{a}_2 = 2\Gamma^{-1}\Gamma a_{in} + \left(1 + \frac{1}{A}\right)\Gamma^{-1}B_f =$$

$$2\Gamma^{-1}\Gamma a_{in} + \left(1 + \frac{1}{A}\right)\Gamma^{-1}\Gamma\left(\frac{\hat{a}_1 - \hat{a}_2}{1 - \frac{1}{A}}\right) = 2a_{in} + \left(\frac{1 + \frac{1}{A}}{1 - \frac{1}{A}}\right)(\hat{a}_1 + \hat{a}_2).$$

This can be rearranged to find $a_{in}$:

$$a_{in} = \frac{(\hat{a}_1 + \hat{a}_2)}{2} - \left(\frac{1 + \frac{1}{A}}{1 - \frac{1}{A}}\right)\frac{(\hat{a}_1 - \hat{a}_2)}{2}.$$

Comparison with the full IA reversal equation confirms that the above matches for the case when A=−1. Once again, one can also write the bias offset in terms of natural acceleration units:

$$B_a = \left( \frac{\hat{a}_1 - \hat{a}_2}{1 - \frac{1}{A}} \right).$$

Figure 3:
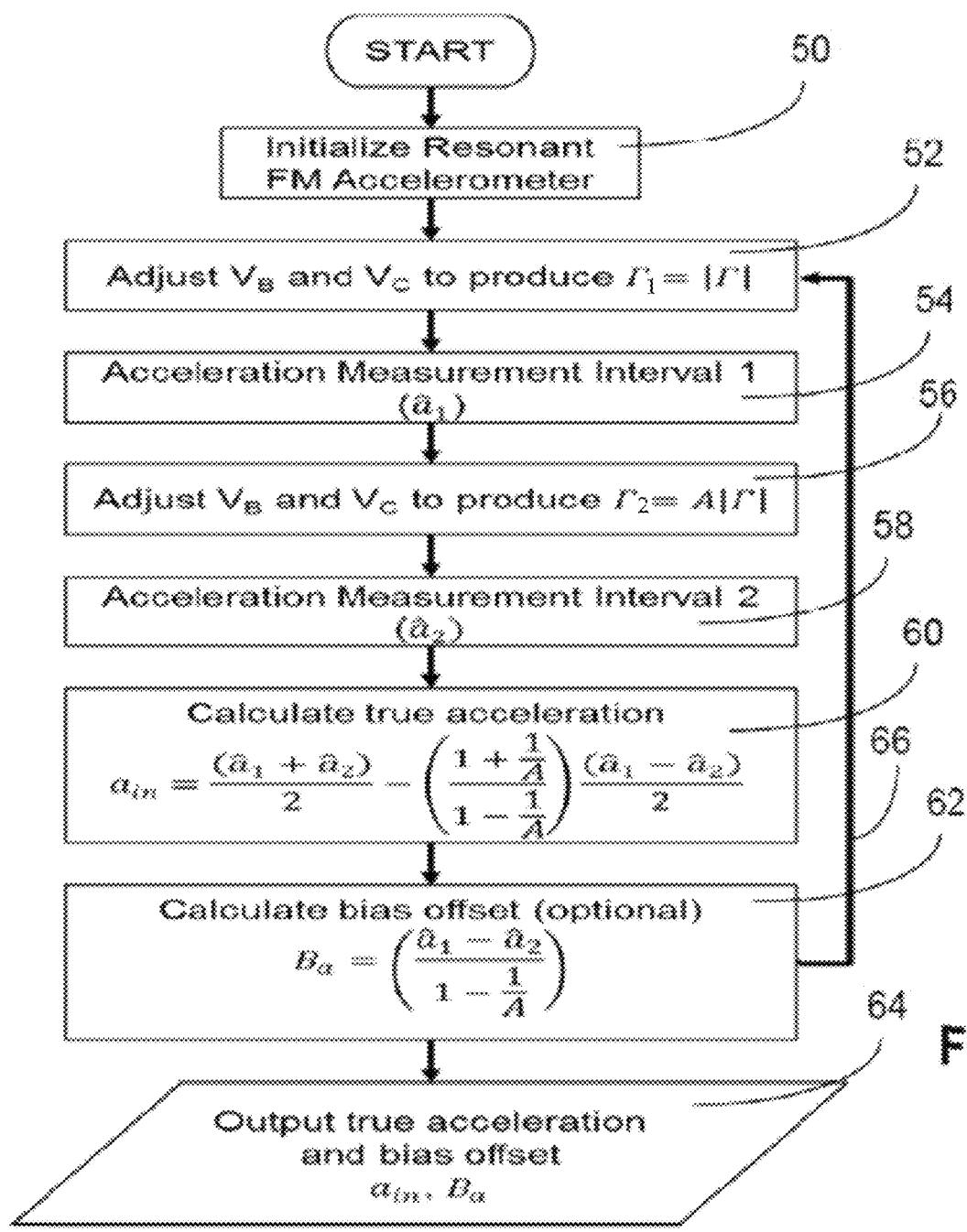
FIG. 3 shows a flow chart for a partial input axis (IA) reversal self-calibration method for a symmetric resonant FM accelerometer in accordance with the present disclosure.

A flow chart describing the self-calibration algorithm using partial IA reversal is shown in FIG. 3. In step 50, the resonant FM accelerometer is initialized to be operational or in a resonant mode and therefore resonating. Then in step 52 bias voltages $V_B$ and $V_C$ are adjusted to produce $\Gamma_1=+|\Gamma|>0$. Next in step 54 an acceleration measurement $\hat{a}_1$ is made over a first interval. Then in step 56 $V_B$ and $V_C$ are adjusted by setting bias voltage $V_B$ and by setting bias voltage $V_c$ to produce $\Gamma_2=A|\Gamma|$, where $A=\Gamma_2/\Gamma_1$. Next in step 58, an acceleration measurement $\hat{a}_2$ is made over a second interval. The first and second interval may have equal time spans. Then in step 60, the true acceleration $$a_{in} = \frac{(\hat{a}_1 + \hat{a}_2)}{2} - \left( \frac{1 + \frac{1}{A}}{1 - \frac{1}{A}} \right) \frac{(\hat{a}_1 - \hat{a}_2)}{2}$$

is calculated. Next in step 62 the bias offset $$B_a = \left( \frac{\hat{a}_1 - \hat{a}_2}{1 - \frac{1}{A}} \right)$$

may be optionally calculated. Finally, in step 64 the true acceleration $a_{in}$ and bias offset $B_a$ may be outputted from the accelerometer. This self-calibration may be continually repeated as shown by the loop 66 from step 62 to step 52.

Having disclosed the mathematical principals underlying accelerometer self-calibration based on full and partial input axis reversal, it is useful to describe a practical implementation of an accelerometer device based on these principals. The example disclosed below is only one example of how one might choose to implement the invention.

Figure 4:
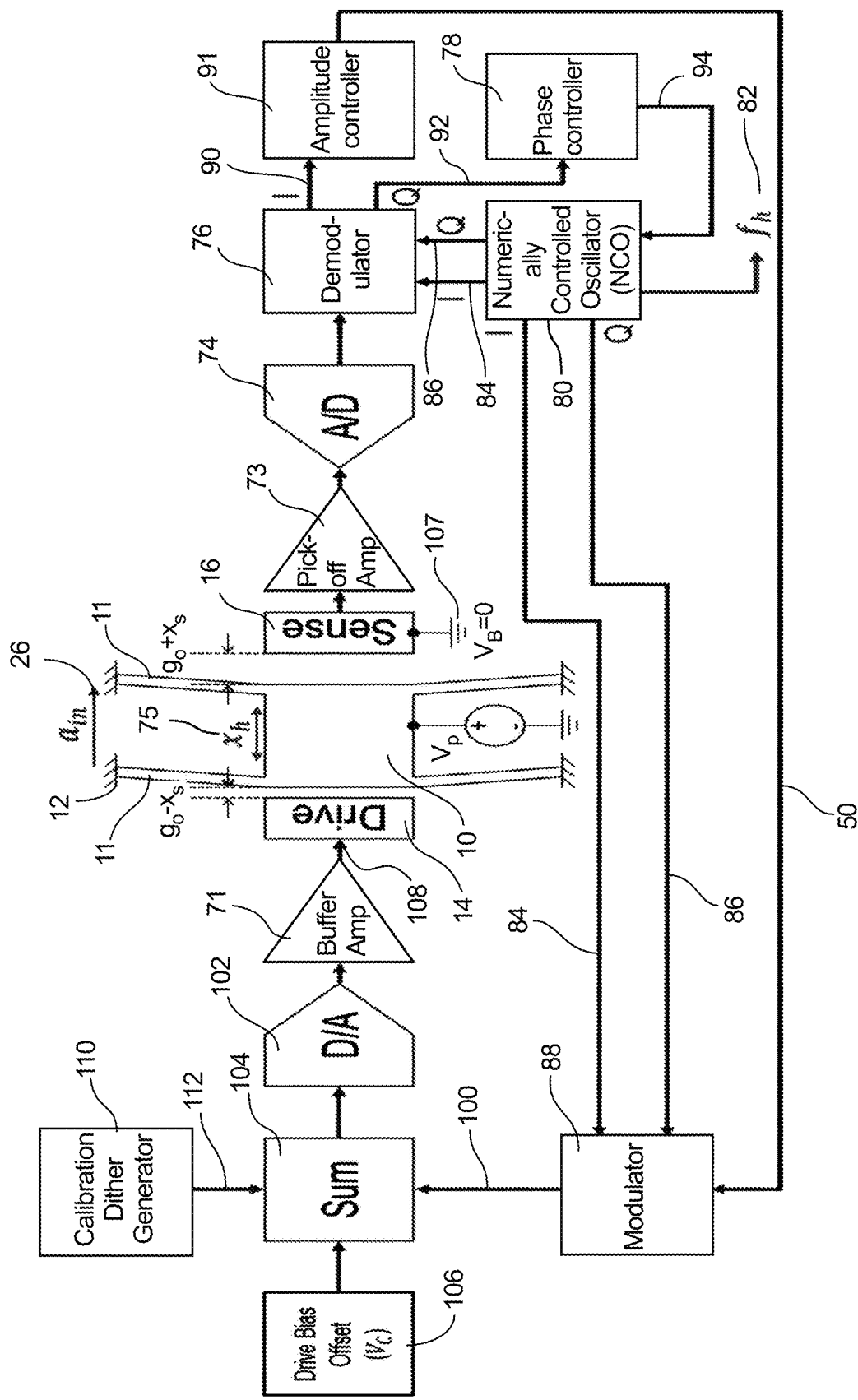
FIG. 4 shows a continuously self-calibrating accelerometer employing partial IA reversal self-calibration in accordance with the present disclosure.
Figure 5:
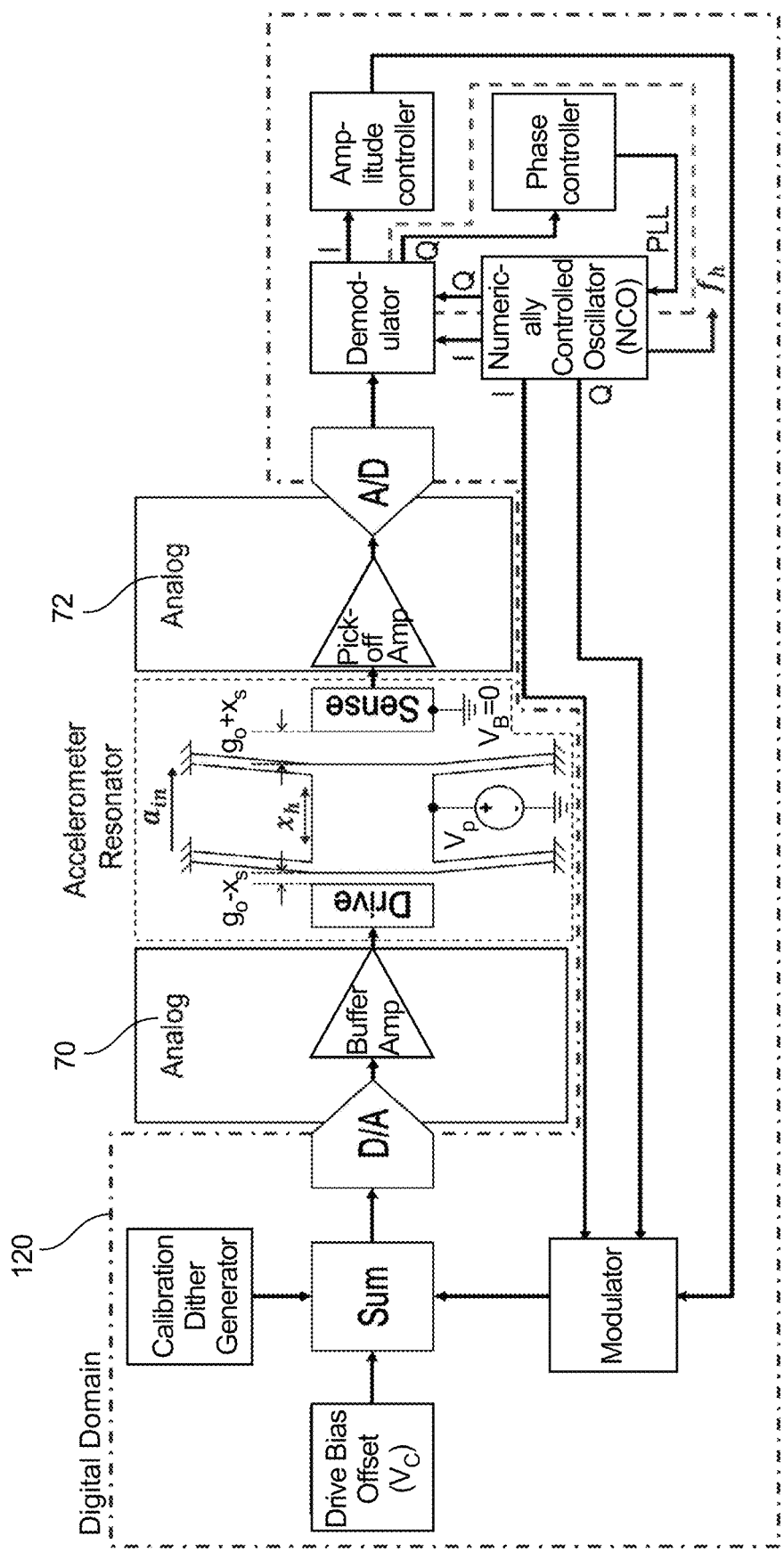
FIG. 5 shows a continuously self-calibrating accelerometer employing partial IA reversal Self-calibration and identifies which specific functionality is implemented in digital electronics, analog electronics, or the electromechanical resonator acting as the acceleration transducer in accordance with the present disclosure.

FIG. 4 shows an embodiment of a continuously self-calibrating accelerometer employing partial IA reversal. FIG. 5 shows the same embodiment but identifies which parts or domains are implemented in digital electronics, analog electronics, or the electromechanical resonator acting as the acceleration transducer.

As in FIG. 1A, the accelerometer electromechanical resonator 10 is implemented as a proof mass suspended by springs 11 which are fixed on one side to the accelerated frame 12 as indicated by the $a_{in}$ arrow 26. The proof mass 10 displaces relatively in the opposite direction in response to an acceleration of its support frame 12. Drive electrode 14 and sense electrode 16 are configured around the proof mass 10 to actuate and sense motion of the proof mass 10. The proof mass 10 is driven into small harmonic oscillations using an amplitude feedback loop. Analog electronics 70, as shown in FIG. 5, which may include amplifiers, including buffer amplifier 71, as shown in FIG. 4, filters, and so on, are used on the drive side to buffer and condition the voltages applied to the drive electrode 14. Analog electronics 72, as shown in FIG. 5, which may include amplifiers, including pick-off amplifier 73, as shown in FIG. 4, filters, and so on, are used on the sense side to amplify the motional current that is picked off the device and convert the current to a voltage that can be read by the analog to digital converter (A/D) 74. As shown in FIG. 5, other parts may be implemented digitally, as shown by digital domain 120.

A phase locked loop (PLL), shown in FIG. 4, may be used to track the phase and frequency of the harmonic motion $x_h$ 75 of the proof mass 10. The phase locked loop (PLL) includes phase controller 78, and numerically controlled oscillator (NCO) 80. The harmonic frequency $f_h$ 82 can be read directly from the numerically controlled oscillator (NCO) 80. The NCO 80 is also used to generate the in phase (I) 84 and quadrature (Q) 86 reference signals for the demodulator 76 and the modulator 88. The demodulator 76 accepts the I 84 and Q 86 reference signals and compares them with its input from the analog to digital converter (A/D) 74. The result is an in-phase (I) component 90 of the signal amplitude as well as the quadrature (Q) component 92.

The Q component 92 is fed to the phase controller 78, which may be implemented, for example, as a proportional-integral (PI) controller, which generates an error signal 94 based on the difference between the phase of the measured motion and the phase of the reference signal. The error signal 94 from the phase controller is used to adjust the NCO 80 until the Q component of the A/D read by the demodulator 76 is nulled to zero, indicating phase lock.

The I component 90 is fed to the amplitude controller 91, which compares it to the desired amplitude set point and generates an error signal 50 used to control the wave amplitude produced by the modulator 88. The desired output 100 of the modulator 88 after being converted to a voltage through the digital to analog (D/A) converter 102 can be expressed as $v_{drive}=V_{drive} \cos(\omega_h t)$.

A summer 104 is used to add the modulator output signal 100 to the drive bias offset 106, which ultimately creates the direct current (DC) bias $V_C$ 108 on the drive electrode 14. The calibration dither generator 110 produces a signal 112 which is used to modulate the scale factor to implement smooth, continuous partial input axis reversal. The summer 104 adds the output 112 of the calibration dither generator 110 to the sum of the modulator output signal 100 and the drive bias offset 106, and the resulting sum of all these signals is fed to the D/A converter 102, where it is buffered and conditioned by buffer amplifier 71 and applied to the drive electrode 14 to control the static gap dimension between the proof mass 10 and the drive electrode 14 and induce a small harmonic oscillation so that the harmonic frequency 82 of the accelerometer system can be read out.

As shown in FIG. 4, the (DC) bias $V_B$ 107 on the sense electrode 16 is 0 volts or ground in this embodiment. This ensures maximum transduction efficiency since the transduction gap voltage is equal to $V_{gap}=V_P-V_B=V_P-0=V_P$, where $V_p$ is the potential of the proof mass 10, as shown in FIG. 4.

In one embodiment, the calibration dither generator can be implemented to have an output 112 $v_{cal}=V_{cal} \cos(\omega_{cal}t)$, where $w_{cal}=2\pi f_{cal}<<\omega_h$ and $f_{cal}$ is less than the bandwidth of the PLL loop so that the PLL can track the calibration dither. The total voltage applied to the drive electrode 14 can now be expressed as $v_{drive\_total}=V_C+V_{drive} \cos(\omega_h t)+V_{cal} \cos(\omega_{cal}t)$. When $\cos(\omega_{cal}t)$ is at its peak, the total effective bias voltage will be $V_C+V_{cal}$, and when $\cos(\omega_{cal}t)$ is at its trough, the total effective bias voltage will be $V_C-V_{cal}$. The effect on the scale factor is such that $\Gamma_1=(1+C)\Gamma_0=\Gamma$ at the peak and $\Gamma_2=(1-C)\Gamma_0=A\Gamma$ at the trough, where $\Gamma_0$ is the nominal scale factor at a bias of $V_C$ and $$C = \frac{V_{cal}}{V_C} \ll 1.$$

Thus, $$A = \frac{\Gamma_2}{\Gamma_1} = \frac{(1-C)\Gamma_0}{(1+C)\Gamma_0} = \left(\frac{1-C}{1+C}\right).$$

Substituting into the equations above for partial IA reversal, by measuring $f_h$ 82 at the peak ($\hat{a}_1$) and at the trough ($\hat{a}_2$) of $\cos(\omega_{cal}t)$, the unbiased accelerometer measurement is:

$$a_{in} = \frac{(\hat{a}_1 + \hat{a}_2)}{2} - \left(\frac{1+\left(\frac{1+C}{1-C}\right)}{1-\left(\frac{1+C}{1-C}\right)}\right)\frac{(\hat{a}_1-\hat{a}_2)}{2}$$

and the bias can be estimated as:

$$B_a = \left(\frac{\hat{a}_1-\hat{a}_2}{1-\left(\frac{1+C}{1-C}\right)}\right).$$

The peak and trough of $\cos(\omega_{cal}t)$ can be obtained in several ways. First, since the calibration dither signal is generated in a known manner, one knows exactly when $\cos(\omega_{cal}t)$ is at its peak or trough and can sample $f_h$ 82 at those instants. A second method that would have less measurement noise would be to demodulate the output of the first demodulator a second time with respect to cos). The twice demodulated amplitude in this way would be proportional to $\hat{a}_1-\hat{a}_2$ and therefore enable determining $B_a$, which could then be subtracted from the acceleration determined by $f_h$ 82. A third method would be to employ signal processing to fit a sinusoid with frequency to the $f_{cal}$ to the $f_h$ data stream and determine the local max ($\hat{a}_1$) and min ($\hat{a}_2$) from the sine wave fit. Additional terms like a linear ramp could be added to improve the fit if necessary.

Figure 6:
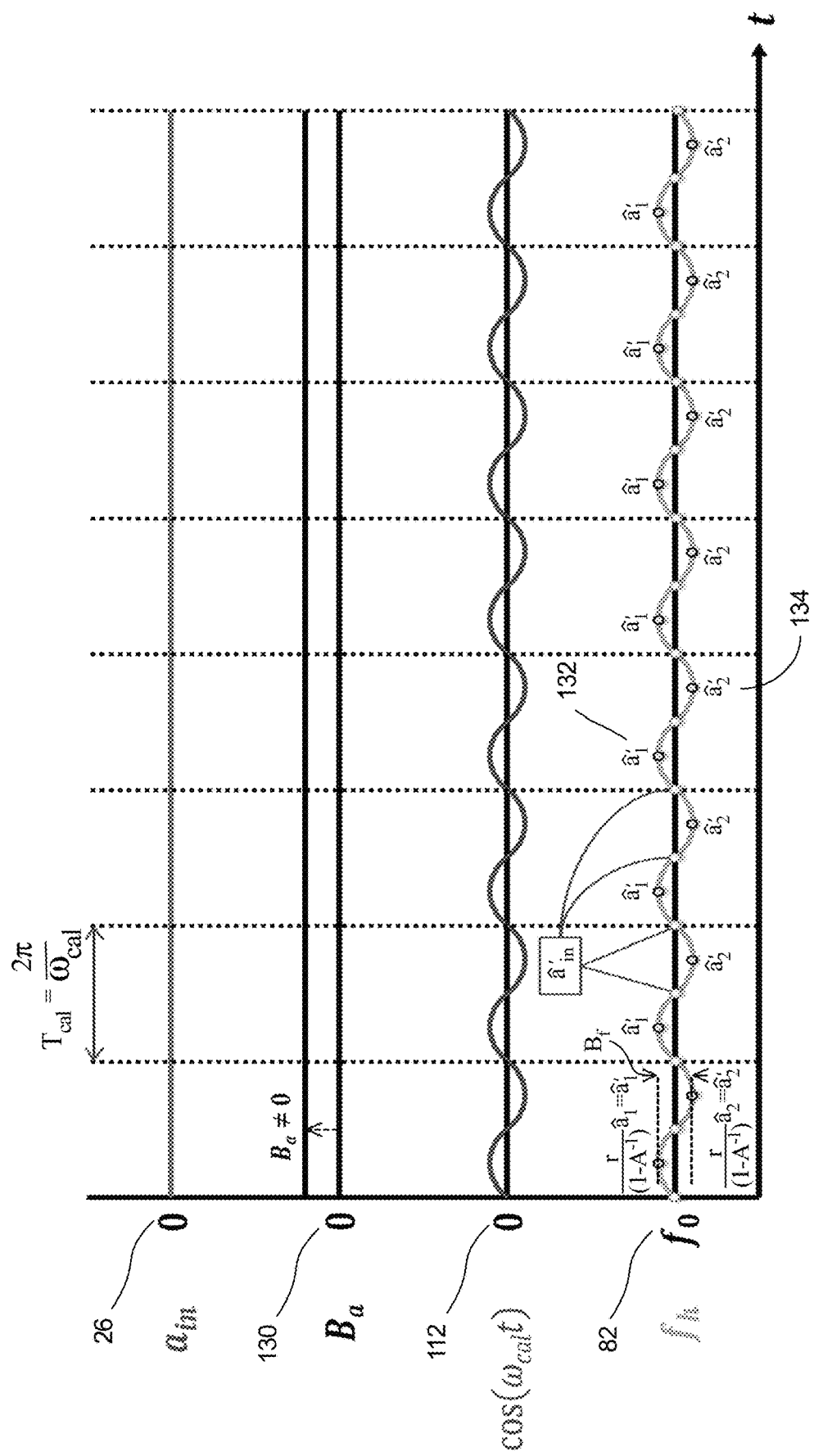
FIG. 6 shows waveforms illustrating partial input axis (IA) reversal self-calibration of a symmetric resonant FM accelerometer by application of a dither voltage proportional to $\cos(\omega_{cal}t)$ to the drive electrode in the absence of applied external acceleration ($a_{in}=0$) but in the presence of an unknown fixed bias offset $B_a$ in accordance with the present disclosure.
Figure 7:
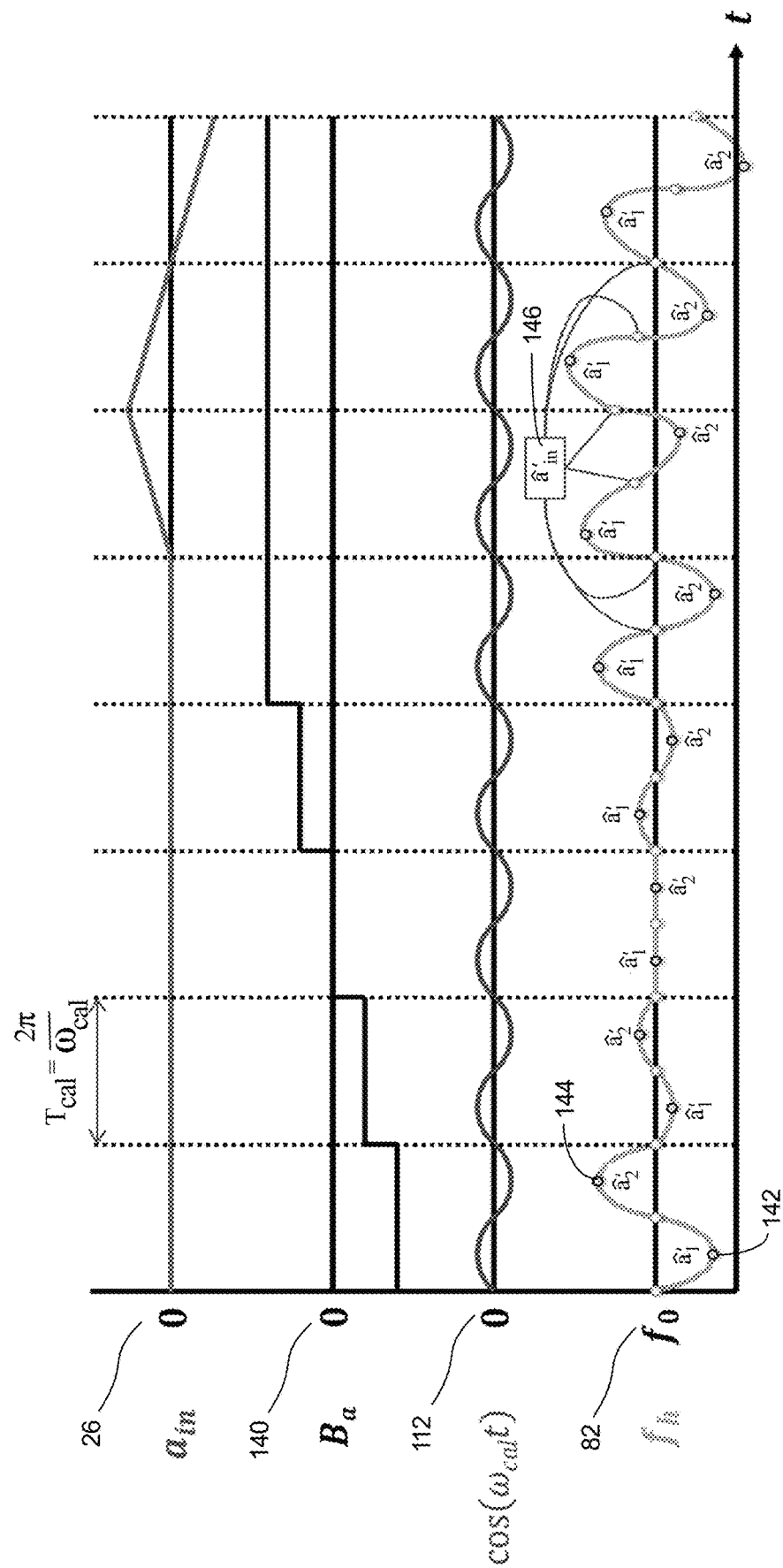
FIG. 7 shows waveforms illustrating partial input axis (IA) reversal self-calibration of the symmetric resonant FM accelerometer by application of a dither voltage proportional to $\cos(\omega_{cal}t)$ to the drive electrode in the presence of an unknown and time varying bias offset $B_a$ and a time varying applied external acceleration in accordance with the present disclosure.

The above methods are conceptually illustrated in FIGS. 6 and 7.

FIG. 6 shows waveforms illustrating partial input axis (IA) reversal self-calibration of a symmetric resonant FM accelerometer by application of a dither voltage 112 proportional to $\cos(\omega_{cal}t)$ to the drive electrode 14 in the absence of applied external acceleration 26 ($a_{in}=0$) but in the presence of an unknown fixed bias offset $B_n$ 130. The vertical distance between the measurements $\hat{a}_1'$ 132 and $\hat{a}_2'$ 134 where the (') indicates the frequency domain equivalent, hat ($\hat{}$) indicates an estimated quantity from the measurement indicated by gray points on the $f_h$ waveform 82 is equal to $B_f$, which is the equivalent bias offset in the frequency domain. The green points indicate moments in time when the $f_h$ 82 waveform is equal to an unbiased estimate of $a_{in}$ in the frequency domain.

FIG. 7 shows waveforms illustrating partial input axis (IA) reversal self-calibration of a symmetric resonant FM accelerometer by application of a dither voltage proportional 112 $\cos(\omega_{cal}t)$ to the drive electrode 14 in the presence of an unknown and time varying bias offset $B_a$ 140 and a time varying applied external acceleration 26. The vertical distance between the measurements $\hat{a}_1'$ 142 and $\hat{a}_2'$ 144, where (') prime indicates the frequency domain equivalent, hat ($\hat{}$) indicates an estimated quantity from the measurement indicated by gray points on the $f_h$ waveform is equal to $B_f$, which is the equivalent bias offset in the frequency domain. The green points 146 indicate moments in time when the $f_h$ waveform is equal to an unbiased estimate of $a_{in}$ in the frequency domain. In the first 5 cycles of $\cos(\omega_{cal}t)$, $B_a$ 140 is shown to increase from a negative offset to a positive offset, and the effect on the $f_h$ 82 waveform is to change the peak to trough distance which indicates $B_f$. It can be seen that even though the peak to trough distance is changing, the unbiased acceleration measurement points (green points) 146 indicate $a_{in}=0$. In the last 3 cycles of $\cos(\omega_{cal}t)$, $B_a$ 140 is held fixed while the applied acceleration is linearly ramped, first increasing for one cycle, and then decreasing for two cycles. The $f_h$ 82 response shows that the unbiased acceleration measurement points track the input acceleration signal, while the peak to trough distance stays the same, in agreement with the fixed $B_a$ 140 signal. This example shows how unbiased acceleration measurements can be made using partial IA reversal, even in the presence of an unknown and time varying bias offset.

The accelerometer in accordance with the present disclosure may be a resonant accelerometer including a proof mass, one or more springs connecting the proof mass to an anchor, and one or more capacitive transduction gaps between the movable proof mass and fixed electrodes, wherein the static displacement of the proof mass in response to acceleration applied to the anchor modifies the electrostatic stiffness imparted by one or more of the capacitive transduction gaps on the proof mass, resulting in a corresponding change in the resonance frequency of the combined electromechanical system.

The accelerometer can be configured to produce a first scale factor through application of a first set of voltages to the capacitive transduction gaps and a second scale factor through application of a second set of voltages to the capacitive transduction gaps.

The accelerometer is first configured to produce the first scale factor and obtain a first measurement of acceleration and then configured to produce the second scale factor and obtain a second measurement of acceleration. The second scale factor may be equal in magnitude to the first scale factor but with opposite sign, which is full input axis reversal, or the second scale factor may be equal to a predetermined fraction of the first scale factor, which is partial input axis reversal.

The first and second measurements of acceleration may be combined to create an unbiased estimate of the true acceleration, and may be combined to create an estimate of the bias offset over the interval of measurement. The scale factor configuration and measurement procedure may be repeated indefinitely or until a break condition is triggered.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method for self-calibration of an accelerometer having a proof mass separated by a first gap from a drive electrode and separated by a second gap from a sense electrode, the method comprising:
   initializing the accelerometer to resonate;
   applying a first bias voltage to the sense electrode and applying a second bias voltage to the drive electrode
   measuring a first acceleration $â_1$ over a first time interval;
   swapping the first bias voltage on the sense electrode with the second bias voltage previously on the drive electrode and the second bias voltage on the drive electrode with the first bias voltage previously on the sense electrode so that a bias voltage on the sense electrode is set to the second bias voltage and a bias voltage on the drive electrode is set to the first bias voltage
   measuring a second acceleration $â_2$ over a second time interval; and
   calculating a true acceleration $$a_{in} = \frac{â_1 + â_2}{2}.$$

2. The method of claim 1 further comprising:
   calculating a bias offset $$B_a = \frac{â_1 - â_2}{2}.$$

3. The method of claim 2 further comprising:
   providing the true acceleration $a_{in}$ and bias offset $B_a$ from the accelerometer.

4. The method of claim 1 further comprising:
   repeating the steps of:
   applying a first bias voltage to the sense electrode and applying a second bias voltage to the drive electrode;
   measuring a first acceleration $â_1$ over a first time interval;
   swapping the first bias voltage on the sense electrode with the second bias voltage previously on the drive electrode and the second bias voltage on the drive electrode with the first bias voltage previously on the sense electrode;
   measuring a second acceleration $â_2$ over a second time interval; and
   calculating a true acceleration $$a_{in} = \frac{â_1 + â_2}{2}.$$

5. The method of claim 1 further comprising:
   amplifying an output of the sense electrode; and
   feeding back an amplified output of the sense electrode to the drive electrode.

6. The method of claim 1 wherein:
   the proof mass is suspended from a frame; and
   the true acceleration is a true acceleration of the frame.

7. The method of claim 1 wherein:
   a time span of the first time interval is the same as a time span of the second time interval.

8. A method for self-calibration of an accelerometer having a proof mass separated by a gap from a drive electrode and separated by a gap from a sense electrode comprising:
   initializing the accelerometer to resonate;
   applying a first bias voltage $V_B$ to the sense electrode and applying a second bias voltage $V_C$ to the drive electrode to obtain a first predetermined scale factor $\Gamma_1$;
   measuring a first acceleration $â_1$ over a first time interval;
   adjusting the first bias voltage $V_B$ to the sense electrode and the second voltage $V_C$ to the drive electrode to obtain a second predetermined scale factor $\Gamma_2$ where;

$$A = \frac{\Gamma_2}{\Gamma_1};$$

measuring a second acceleration $â_2$ over a second time interval; and
   calculating a true acceleration $$a_{in} = \frac{(â_1 + â_2)}{2} - \left(\frac{1 + \frac{1}{A}}{1 - \frac{1}{A}}\right)\frac{(â_1 - â_2)}{2}.$$

9. The method of claim 8 further comprising:
   calculating a bias offset $$B_a = \left(\frac{â_1 - â_2}{1 - \frac{1}{A}}\right).$$

10. The method of claim 9 further comprising:
    providing the true acceleration $a_{in}$ and bias offset $B_a$ from the accelerometer.

11. The method of claim 8 further comprising:
repeating the steps of:
applying a first bias voltage to the sense electrode and applying a second bias voltage $V_C$ to the drive electrode to obtain a first predetermined scale factor $\Gamma_1$;
measuring a first acceleration $â_1$ over a first time interval;
adjusting the first bias voltage $V_B$ to the sense electrode and the second voltage $V_C$ to the drive electrode to obtain a second predetermined scale factor $\Gamma_2$, where $$A = \frac{\Gamma_2}{\Gamma_1};$$

measuring a second acceleration $â_2$ over a second time interval; and
calculating a true acceleration $$a_{in} = \frac{(â_1 + â_2)}{2} - \left(\frac{1 + \frac{1}{A}}{1 - \frac{1}{A}}\right)\frac{(â_1 - â_2)}{2}.$$

12. The method of claim 8 wherein:
the proof mass is suspended from a frame; and
the true acceleration is a true acceleration of the frame.

13. The method of claim 8 wherein:
a time span of the first time interval is the same as a time span of the second time interval.

14. An accelerometer for providing continuous self-calibration comprising:
a proof mass suspended from a frame;
a drive electrode separated from the proof mass by a first gap;
a sense electrode separated from the proof mass by a second gap;
an amplitude feedback loop arranged between the drive electrode and the sense electrode for initializing the accelerometer to resonate;
the amplitude feedback loop being further arranged for:
applying a first bias voltage to the sense electrode and applying a second bias voltage to the drive electrode to obtain a first predetermined scale factor $\Gamma_1$;
measuring a first acceleration $â_1$ over a first time interval;
adjusting the first bias voltage $V_B$ to the sense electrode and the second voltage $V_C$ to the drive electrode to obtain a second predetermined scale factor $\Gamma_2$, where $A=\Gamma_2/\Gamma_1$;
measuring a second acceleration $â_2$ over a second time interval; and
calculating a true acceleration $$a_{in} = \frac{(â_1 + â_2)}{2} - \left(\frac{1 + \frac{1}{A}}{1 - \frac{1}{A}}\right)\frac{(â_1 - â_2)}{2}$$

of the accelerometer.

15. The accelerometer of claim 14, wherein said amplitude feedback loop comprises:
a phase lock loop circuit coupled to the sense electrode and having a phase lock loop output;
a calibration dither generator for generating a dither output for modulating a scale factor;
a drive bias offset voltage $V_c$;
a summer coupled to the phase lock loop output, the dither output, and the drive bias offset voltage $V_c$ for providing a summer output having a sum of the phase lock loop output, the dither output, and the drive bias offset voltage $V_c$;
wherein the summer output is coupled to the drive electrode; and
wherein the phase lock loop circuit outputs the harmonic frequency of the accelerometer; the accelerometer further comprising:
a digital to analog converter coupled to the summer output; and
a buffer amplifier coupled to an output of the digital to analog converter;
wherein an output of the buffer amplifier is coupled to the drive electrode.

16. The accelerometer of claim 15 further comprising:
an amplifier coupled to the sense electrode; and
an analog to digital converter coupled to the amplifier and having an output coupled to the phase lock loop circuit.

17. The accelerometer of claim 16 wherein the phase lock loop circuit comprises:
a demodulator coupled to the output of the analog to digital converter for generating an in-phase signal and a quadrature signal;
an amplitude controller coupled to the in-phase signal;
a phase controller coupled to the quadrature signal;
a numerically controlled oscillator coupled to the phase controller for generating a reference in-phase signal and a reference quadrature signal each coupled to the demodulator; and
a modulator coupled to the reference in-phase signal and the reference quadrature signal and coupled to an output of the amplitude controller, wherein an output of the modulator comprises the phase lock loop output.

18. The accelerometer of claim 15:
wherein the dither output comprises $v_{cal}=V_{cal}\cos(\omega_{cal}t)$, where $\omega_{cal}=2\pi f_{cal}<<\omega_h$ and where $f_{cal}$ is less than a bandwidth of the phase lock loop circuit;
wherein the summer output is $v_{drive\_total}=V_C+V_{drive}\cos(\omega_h t)+V_{cal}\cos(\omega_{co}t)$;
wherein when $\cos(\omega_{cal}t)$ is at a peak, a total effective bias voltage is $v_C+v_{cal}$, and when $\cos(\omega_{cal}t)$ is at a trough, the total effective bias voltage is $v_C-V_{cal}$;
wherein the scale factor is such that $\Gamma_1=(1+C)\Gamma_0=\Gamma$ at the peak and $\Gamma_2=(1-C)\Gamma_0=A\Gamma$ at the trough, where $\Gamma_0$ is a nominal scale factor at a bias of $v_C$ and $$C = \frac{V_{cal}}{V_C} \ll 1;$$

and
wherein $$A = \frac{\Gamma_2}{\Gamma_1} = \frac{(1-C)\Gamma_0}{(1+C)\Gamma_0} = \left(\frac{1-C}{1+C}\right).$$

19. The accelerometer of claim 18:
wherein the harmonic frequency at a peak is $â_1$;
wherein the harmonic frequency at a trough is $â_2$.

20. The accelerometer of claim 19:
wherein an unbiased accelerometer measurement comprises:

$$a_{in} = \frac{(\hat{a}_1 + \hat{a}_2)}{2} - \left(\frac{1 + \left(\frac{1+C}{1-C}\right)}{1 - \left(\frac{1+C}{1-C}\right)}\right)\frac{(\hat{a}_1 - \hat{a}_2)}{2}.$$

21. The accelerometer of claim 19:
wherein a bias offset comprises $$B_a = \left(\frac{\hat{a}_1 - \hat{a}_2}{1 - \left(\frac{1+C}{1-C}\right)}\right).$$

22. An accelerometer for providing continuous self-calibration comprising:
   a proof mass suspended from a frame;
   a drive electrode separated from the proof mass by a first gap;
   a sense electrode separated from the proof mass by a second gap;
   an amplitude feedback loop arranged between the drive electrode and the sense electrode for initializing the accelerometer to resonate;
   the amplitude feedback loop being further arranged for:
   applying a first bias voltage to the sense electrode and applying a second bias voltage to the drive electrode;
   measuring a first acceleration $\hat{a}_1$ over a first time interval;
   swapping the first bias voltage on the sense electrode with the second bias voltage previously on the drive electrode and the second bias voltage on the drive electrode with the first bias voltage previously on the sense electrode so that a bias voltage on the sense electrode is set to the second bias voltage and a bias voltage on the drive electrode is set to the first bias voltage;
   measuring a second acceleration $\hat{a}_2$ over a second time interval; and
   calculating a true acceleration $$a_{in} = \frac{\hat{a}_1 + \hat{a}_2}{2}.$$

* * * * *